(12) United States Patent
Filip

(10) Patent No.: US 6,188,280 B1
(45) Date of Patent: Feb. 13, 2001

(54) DIFFERENTIAL AMPLIFIER WITH GAIN LINEARIZATION THROUGH TRANSCONDUCTANCE COMPENSATION

(75) Inventor: Jan Filip, Burgdorf (DE)

(73) Assignee: Maxim Integrated Products, Sunnyvale, CA (US)

( * ) Notice: Under 35 U.S.C. 154(b), the term of this patent shall be extended for 0 days.

(21) Appl. No.: 09/141,874

(22) Filed: Aug. 27, 1998

(51) Int. Cl.[7] ....................................... H03F 3/45
(52) U.S. Cl. .............................. 330/252; 330/260
(58) Field of Search ............................ 330/252, 260, 330/311

(56) References Cited

U.S. PATENT DOCUMENTS

| | | | |
|---|---|---|---|
| 4,780,688 | 10/1988 | Groom | 330/261 |
| 5,289,136 | 2/1994 | DeVeirman et al. | 330/252 |
| 5,392,002 | * 2/1995 | Delano | 330/252 |
| 5,461,342 | * 10/1995 | Crabtree | 330/252 |
| 5,481,224 | 1/1996 | Kimura | 330/253 |
| 5,525,930 | * 6/1996 | Pothast et al. | 330/252 |
| 5,552,742 | 9/1996 | Perkins | 327/563 |

* cited by examiner

Primary Examiner—Steven J. Mottola
(74) Attorney, Agent, or Firm—Hickman Coleman & Hughes, LLP

(57) ABSTRACT

Disclosed is a differential amplifier including an emitter follower pair, a first differential pair, and a main differential amplifier. The emitter follower pair is operative to receive an input differential voltage signal for shifting the input differential voltage signal to develop a shifted differential voltage signal. The first differential pair is configured to feed a first differential current inversely to the emitter follower pair so that a transconductance of the emitter follower pair changes inversely to compensate for a change in a transconductance of the first differential pair. The main differential amplifier is coupled to receive the shifted differential voltage signal and is configured to amplify the shifted differential voltage signal to generate an output voltage signal.

65 Claims, 4 Drawing Sheets

DIFFERENTIAL AMPLIFIER WITH GAIN LINEARIZATION THROUGH TRANSCONDUCTANCE COMPENSATION

FIELD OF THE INVENTION

The present claimed invention relates to the field of differential amplifiers. More particularly, the present claimed invention relates to differential amplifiers that generate linear gain through transconductance compensation.

BACKGROUND ART

Differential amplifiers are widely used in analog and digital circuits to amplify a differential voltage between two input signals. Ideally, a differential amplifier amplifies only the difference between the input signals while rejecting common-mode input changes such as noise. Differential amplifiers have found important applications where signals are contaminated by noise signals. For example, digital signals transmitted over a long cable may pick up miscellaneous noise signals during the signal transmission. The differential amplifiers reject the noise signals while amplifying the digital signals, thereby leading to the recovery of the original signals.

Unfortunately, conventional differential amplifiers present several drawbacks. For example, fully differential amplifier circuits often suffer from limited linear operating ranges as described in U.S. Pat. No. 5,289,136 by DeVeirman et al., the disclosure of which is incorporated herein in its entirety. As a result, the differential amplifier circuits can only receive a narrow range of input voltages to produce a linear output. If the input voltages venture outside of the narrow input voltage range, the differential amplifier circuits produce a non-linear output.

In addition, the gain of conventional differential amplifiers may vary in response to a change in temperature. This is because base-emitter voltages of individual transistors in the differential amplifiers are highly sensitive to temperature variation. Since base-emitter voltages affect the transconductance of a transistor, the gain of the differential amplifier may not be constant or linear when such temperature variation occurs. In such cases, the gain of the conventional differential amplifiers may not be predictable due to the temperature variations.

Furthermore, the conventional differential amplifiers may not provide sufficient gain for today's state of the art low current or low voltage applications. For example, the state of the art high speed analog or digital circuits often employ low currents and/or low voltages to speed up the operation of the circuit while reducing power requirements for continuously decreasing die sizes. At such low currents and/or voltages, the conventional differential amplifiers may not provide a large enough gain to operate properly in high speed applications.

Thus, what is needed is a differential amplifier that provides a large and predictable linear gain over a wide input range. What is also needed is a differential amplifier that provides such linear gain even in low current and low voltage applications.

SUMMARY OF THE INVENTION

Broadly speaking, the present invention fills these needs by providing a differential amplifier having transconductance compensating circuitry to provide a linear gain over a wide input range. It should be appreciated that the present invention can be implemented in numerous ways, including as a process, an apparatus, a system, a device, or a method. Several inventive embodiments of the present invention are described below.

In one embodiment, the present invention provides a differential amplifier including an emitter follower pair, a first differential pair, and a main differential amplifier. The emitter follower pair is operative to receive an input differential voltage signal for shifting the input differential voltage signal to develop a shifted differential voltage signal. The first differential pair is configured to feed a first differential current inversely to the emitter follower pair so that a transconductance of the emitter follower pair changes inversely to compensate for a change in a transconductance of the first differential pair. The main differential amplifier is coupled to receive the shifted differential voltage signal and is configured to amplify the shifted differential voltage signal to generate an output voltage signal.

In another embodiment, the present invention provides a transconductance compensating circuit for a differential amplifier having a main differential pair. The compensating circuit includes an emitter follower pair and a first differential pair. The emitter follower pair is operative to receive an input differential voltage signal for shifting the input differential voltage signal to develop a shifted differential voltage signal. The first differential pair is configured to feed a first differential current inversely to the emitter follower pair such that a transconductance of the emitter follower pair changes inversely to compensate for a change in a transconductance of the first differential pair.

In yet another embodiment, the present invention provides a method for compensating variations in transconductance of a differential amplifier. The method includes (a) receiving, by a pair of emitter follower transistors, a differential input voltage; (b) providing, by a pair of differential pair of transistors, a compensating differential current inversely to the emitter follower transistors; (c) changing a transconductance of the emitter follower transistors inversely to compensate for a change in a transconductance of the differential pair transistors; and (d) shifting, by the emitter follower pair of transistors, the DC voltage level of the differential input voltage by a specified voltage in accordance with the change in the transconductance of the emitter follower pair transistors.

In another embodiment, a transconductance compensating circuit for a differential amplifier is disclosed. The transconductance compensating circuit includes input means and differential current providing means. The input means receives and shifts an input differential voltage signal to develop a shifted differential voltage signal. The differential current providing means provides a first differential current inversely to the input means such that a transconductance of the receiving and shifting means changes inversely to compensate for a change in a transconductance of the differential current providing means.

Advantageously, the differential amplifier of the present invention provides a large linear gain over a wide input range by compensating for transconductance variations of differential amplifier transistors. In addition, the differential amplifier provides such linear gain even in low current and low voltage applications by utilizing level shifting circuitry. Furthermore, the gain of the differential amplifier is highly predictable because the gain depends only on a set of resistors and not on the transconductance of transistors in the differential amplifier. Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF THE PREFERRED EMBODIMENTS

In the following detailed description of the present invention, differential amplifier having transconductance compensating circuitry to provide a linear gain over a wide input range, numerous specific details are set forth in order to provide a thorough understanding of the present invention. However, it will be obvious to one skilled in the art that the present invention may be practiced without these specific details. In other instances, well known methods, procedures, components, and circuits have not been described in detail so as not to unnecessarily obscure aspects of the present invention.

The differential amplifier of the present invention provides a large and predictable linear gain over a wide input voltage range. The differential amplifier provides a main differential pair and a secondary differential pair coupled in parallel with the main differential pair. The main differential pair develops a first differential current and the secondary differential pair develops a second differential current. The first differential current is applied to a pair of load resistors to generate a differential output voltage. On the other hand, the second differential current is applied inversely to an emitter follower pair. The inversely applied second differential current operates to produce a base-emitter voltage drop in emitter follower pair that substantially compensates for a change in a base-emitter voltage drop in the main and secondary differential pairs. In this configuration, the value of load resistance and emitter series feedback resistance in the differential amplifier determines the amount of linear gain.

Figure 1:
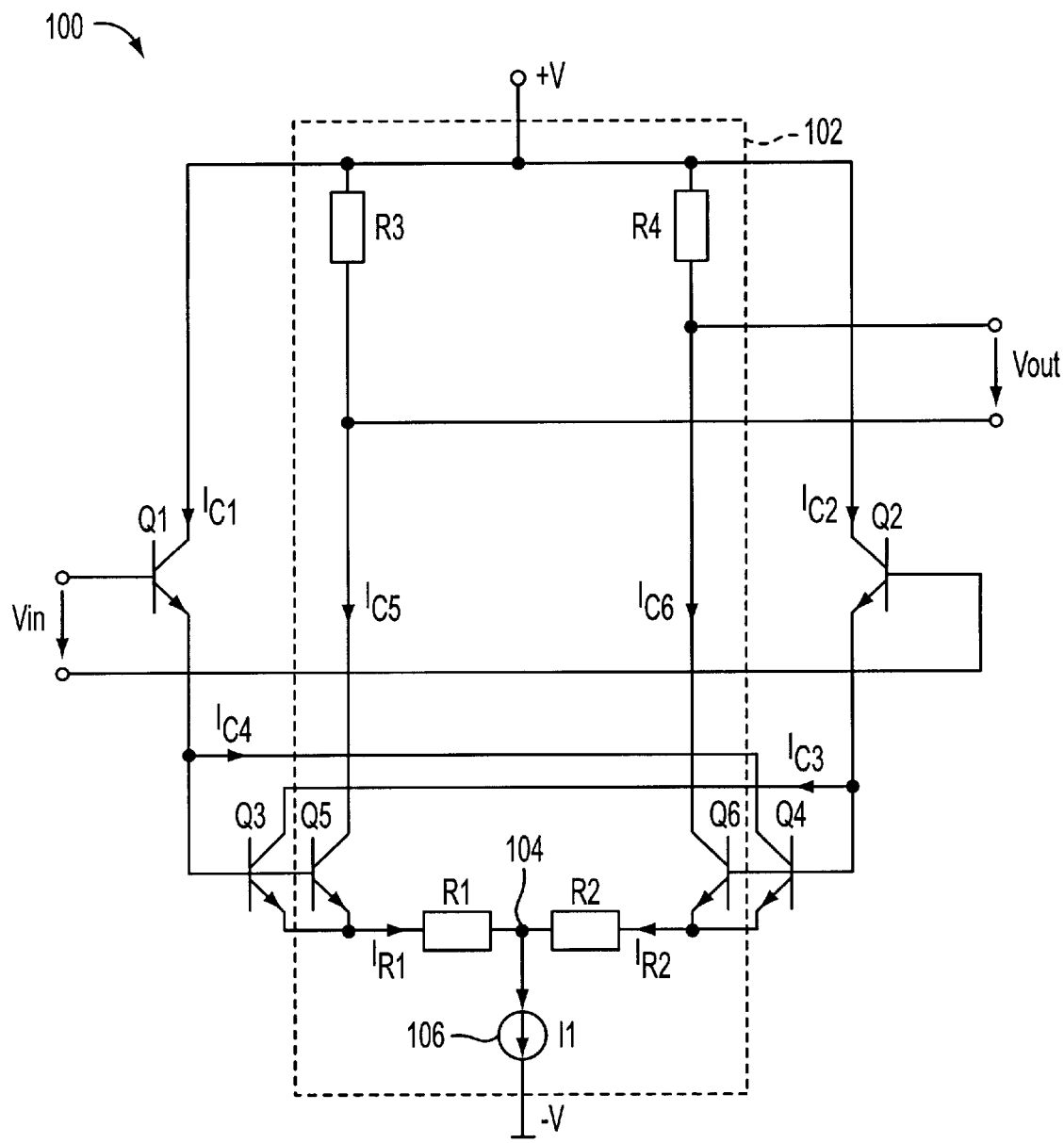
FIG. 1 illustrates a differential amplifier in accordance with one embodiment of the present invention.

With reference to FIG. 1, a differential amplifier 100 includes a main differential amplifier 102, a secondary differential pair, and an emitter follower pair in accordance with one embodiment of the present invention. The main differential amplifier 102 includes a main differential pair, a pair of load resistors R3 and R4, a pair of emitter series feedback resistors R1 and R2, and a current source 106. The main differential pair includes a pair of transistors Q5 and Q6. Transistors Q5 and Q6 are preferably bipolar junction transistors, each having a base, a collector, and an emitter. The collectors of transistors Q5 and Q6 are coupled to resistors R3 and R4, respectively, which are, in turn, coupled to a positive supply voltage potential, +V.

The emitters of transistors Q5 and Q6 are coupled to the emitter series feedback resistors R1 and R2, respectively. The emitter series feedback resistors R1 and R2 are coupled to each other at a junction 104. The current source 106 is coupled between the junction 104 of resistors R1 and R2 and a negative supply voltage potential, −V. The current source provides constant currents $I_{R1}$ and $I_{R2}$ through resistors R1 and R2, respectively.

In accordance with a preferred embodiment of the present invention, the main differential amplifier is configured to be symmetrical. Specifically, transistors Q5 and Q6 are matching transistors having substantially equal emitter areas. The load resistors R3 and R4 are matching resistors. Likewise, the emitter series feedback resistors R1 and R2 are also matching resistors.

The symmetry of the main differential amplifier causes the current I1 of the current source 106 to be split evenly between the two transistors Q5 and Q6. That is, the currents $I_{R1}$ and $I_{R2}$ are approximately equal and each current has a value of about ½ of the current I1 provided by the current source 106. Further, if the base currents of the transistors Q5 and Q6 are assumed to be approximately zero, the collector currents $I_{C5}$ and $I_{C6}$ of transistors Q5 and Q6, respectively, are approximately equal to the currents $I_{R1}$ and $I_{R2}$, respectively. Since the currents $I_{R1}$ and $I_{R2}$ are approximately equal, the collector currents of transistors Q5 and Q6 are also approximately equal. The collector currents $I_{C5}$ and $I_{C6}$ causes a differential voltage drop across the load resistors R3 and R4, respectively, to generate an output differential voltage signal Vout. Although the present invention employs a differential output voltage, those skilled in the art will appreciate that it may also take an output voltage from either collector of transistors Q5 and Q6.

The secondary differential pair includes a pair of transistors Q3 and Q4, which are preferably bipolar junction transistors having a base, an emitter, and a collector. Transistors Q3 and Q4 are coupled in parallel to the transistors Q4 and Q6, respectively, and are arranged in a symmetrical configuration in the differential amplifier 100. Specifically, the base of transistor Q3 is coupled to the base of transistor Q5 to form common-base transistors Q3 and Q5 while the base of transistor Q4 is coupled to the base of transistor Q6 to form common-base transistors Q4 and Q6. The transistors Q3 and Q4 are preferably matching transistors having matching emitter areas.

However, the collectors of transistors Q3 and Q4 are cross-coupled in the differential amplifier 100. In particular, the collector of transistor Q3 is coupled to the common bases of transistors Q4 and Q6 whereas the collector of transistor Q4 is coupled to the common bases of transistors Q3 and Q5.

The emitter follower pair is coupled to the common bases to form a compensation circuit and includes a pair of transistors Q1 and Q2 configured to receive a differential input voltage signal, Vin. Transistors Q1 and Q2 are preferably bipolar junction transistors having an emitter, a collector, and a base. The collectors of transistors Q1 and Q2 are coupled to a positive supply voltage potential, +V. The emitter of the emitter follower transistor Q1 is coupled to the common base of transistors Q3 and Q5 while the emitter of the emitter follower transistor Q2 is coupled to the common base of transistors Q4 and Q6. Transistors Q1 and Q2 receive the differential input voltage signal, Vin, across the base terminals. The differential output voltage signal, Vout, is taken across the collectors of the main differential transistor pair Q5 and Q6.

Preferably, transistors Q1 and Q2 are matching transistors. In addition, the matching transistors Q1 and Q2 are also matched to matching transistors Q3 and Q4 in accordance with a preferred embodiment of the present invention. As such, all four transistors Q1, Q2, Q3, and Q4 are matching transistors with substantially identical emitter areas A1, A2, A3, and A4, respectively.

To simplify explanations in the operation of the differential amplifier 100, the base currents of all transistors in the differential amplifier 100 are assumed to be negligible. Thus, the emitter and collector currents of the each of the transistors in the differential amplifier 100 are assumed to be equal. Those skilled in the art will readily recognize that these approximations typically yield results that substantially conform to results in practice.

In the differential amplifier 100, the emitter areas of the transistors determine the division of current I1 in the differential amplifier 100. The current I1, which is provided by the current source 106, is split evenly between currents $I_{R1}$ and $I_{R2}$ through resistors R1 and R2, respectively, due to symmetry of the differential amplifier 100. Current $I_{R1}$ is the sum of currents $I_{C3}$ and $I_{C5}$ while current $I_{R2}$ is the sum of currents $I_{C4}$ and $I_{C6}$.

In one embodiment, transistors Q4 and Q6 are matching transistors having substantially equal emitter areas. Similarly transistors Q3 and Q5 are also matching transistors having substantially same emitter areas. In a preferred embodiment, transistors Q1, Q2, Q3, Q4, Q5, and Q6 are matching transistors having matching emitter areas. In this matching transistor configuration, currents $I_{R1}$ and $I_{R2}$ are divided equally. That is, currents $I_{C3}$ and $I_{C5}$ are equal and currents $I_{C4}$ and $I_{C6}$ are equal. On the other hand, if the emitter area A6 of transistor Q6 is twice the area of Q4, for example, then one third of current $I_{R2}$ flows through transistor Q4 and the rest flows through transistor Q6.

The differential amplifier 100 provides two differential currents: a main differential current defined as a difference between currents $I_{C5}$ and $I_{C6}$ (eg., $I_{C5}-I_{C6}$) and a secondary differential current defined as a difference between currents $I_{C3}$ and $I_{C4}$ (e.g., $I_{C3}-I_{C4}$). Currents $I_{C5}$ and $I_{C6}$ of the main differential current flow through the load resistors R3 and R4, respectively, to develop the differential output voltage Vout. On the other hand, the emitters of the emitter follower transistors Q1 and Q2 are cross-connected to the collectors of transistors Q4 and Q3, respectively. The cross-coupling of the transistors allows transistors Q3 and Q4 to feed currents $I_{C3}$ and $I_{C4}$ of the secondary differential current back to the emitter follower transistors Q2 and Q1, respectively. In this manner, the differential amplifier 100 provides the secondary differential current inversely to the emitter follower transistors Q1 and Q2.

The emitter follower transistors Q1 and Q2 are adapted to function as linearization circuitry by compensating for non-linear characteristics of transistors Q3 and Q4 so that transistors Q5 and Q6 may function in a linear mode. The emitter follower transistors Q1 and Q2 shift the DC voltage level of the differential input voltage Vin and feed the shifted input voltage to the bases of the main differential pair (e.g., transistor Q5 and Q6) and the secondary differential pair (e.g., transistors Q3 and Q4). Since the base-emitter voltage of a transistor is typically determined by its emitter area and emitter current, the differential amplifier 100 provides matching current to matching transistors in accordance with one embodiment of the present invention. Specifically, transistors Q1, Q2, Q3, and Q4 are matching transistors with substantially identical emitter areas A1, A2, A3, and A4, respectively. The matching transistors Q3 and Q4, in particular, develop identical collector currents $I_{C3}$ and $I_{C4}$.

The feedback of the collector current $I_{C3}$ as emitter current of transistor Q1, in turn, develops substantially identical base-emitter voltages $V_{BE1}$ and $V_{BE4}$. This is because the matching transistors Q1 and Q4 have substantially identical current, $I_{C3}$, assuming negligible base currents. Similarly, the feedback of the collector current $I_{C4}$ as emitter current of transistor Q2 produces substantially identical base-emitter voltages $V_{BE2}$ and $V_{BE3}$. Accordingly, the emitter follower transistors Q1 and Q2 compensates for variations in base-emitter voltages of transistors Q3 and Q4 to reduce non-linear characteristics of the differential amplifier 100. In a preferred embodiment, this compensation scheme also forces the base-emitter voltages $V_{BE5}$ and $V_{BE6}$ of transistors Q5 and Q6 to be equal to $V_{BE3}$ and $V_{BE4}$, respectively. Moreover, if transistors Q5 and Q6 are matching transistors to Q3 and Q4, then the gain of transistors Q5 and Q6 will be substantially linear.

The compensation of base-emitter voltages of the transistors allows compensation of transconductance gm of the differential amplifier 100. Thus, the gain may be determined by the emitter series resistors R1 and R2, and the load impedance R3 and R4. Neglecting base currents and parasitic resistances, the gain can be determined in accordance with the following formula:

$$Gain = \frac{Vout}{Vin} = \frac{R3}{R1}\left(\frac{A6}{A6+A4}\right) = \frac{R4}{R2}\left(\frac{A5}{A5+A3}\right); \quad \text{Equation (1)}$$

As seen from the equation, the gain of the differential amplifier can be controlled by using resistor and transistors with appropriate resistance and emitter areas. For example, the gain can be decreased by means of the factor given in the above equation depending on the emitter areas of the transistors A3, A4, A5, and A6.

Figure 2:
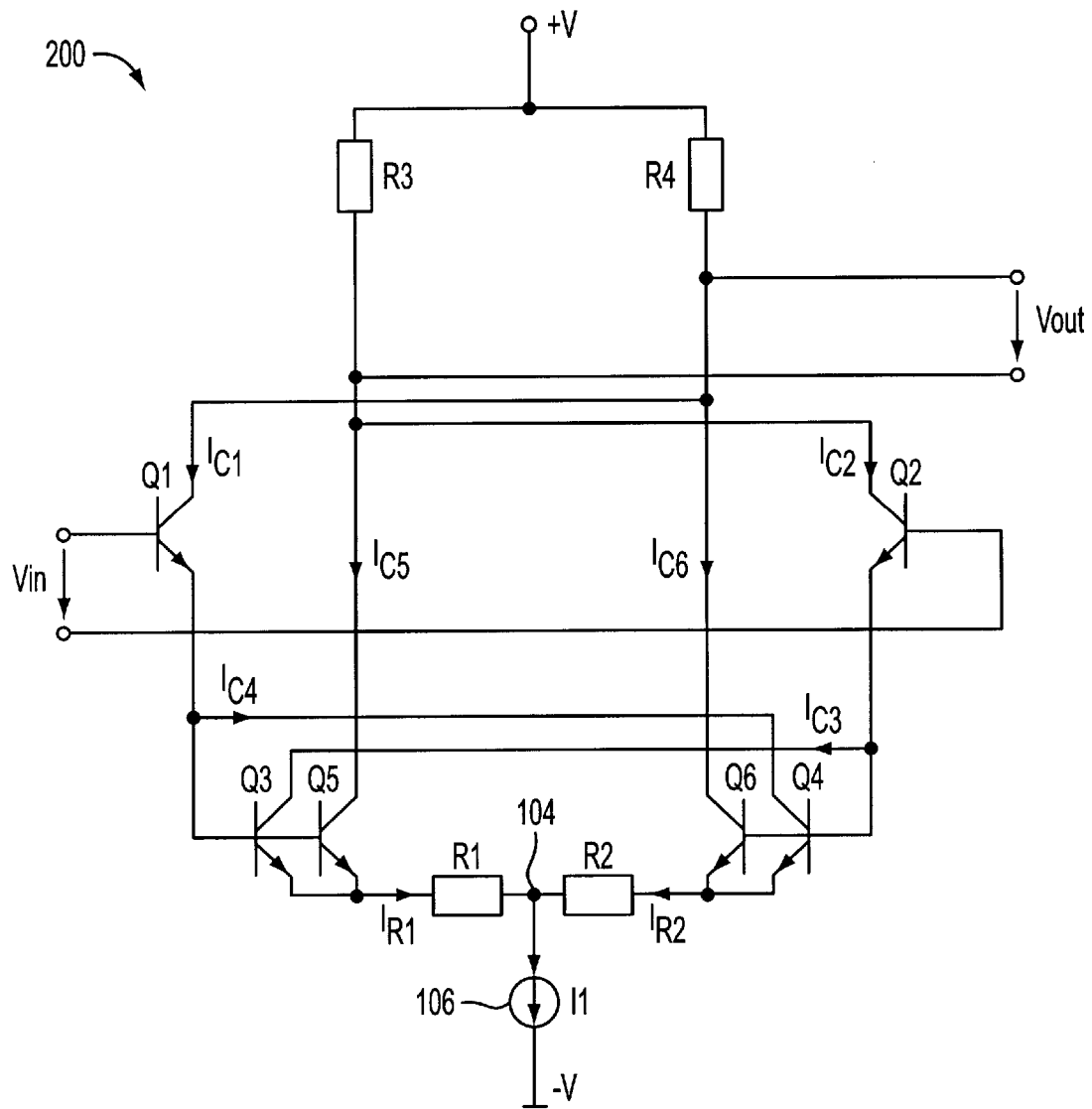
FIG. 2 illustrates a differential amplifier in which the collector currents of emitter follower transistors Q1 and Q2 are fed back to load resistors R4 and R3, respectively, in accordance with one embodiment of the present invention.

The differential amplifier 100 may also be modified to provide a larger gain. FIG. 2 illustrates a differential amplifier 200 in which the collector currents of emitter follower transistors Q1 and Q2 are fed back to the load resistors R4 and R3, respectively in accordance with one embodiment of the present invention. The feedback of the collector currents $I_{C1}$ and $I_{C2}$ to the load resistors R4 and R3, respectively, provides transconductance compensation by allowing additive superposition of the currents with the differential current from transistors Q5 and Q6. Accordingly, the differential amplifier 200 avoids loss of gain through this transconductance compensation. The gain of the differential amplifier 200 is determined as follows:

$$Gain = \frac{Vout}{Vin} = \frac{R3}{R1} = \frac{R4}{R2}; \quad \text{Equation (2)}$$

As seen from equation (2), the differential amplifier 200 provides a larger gain than the amplifier of FIG. 1 since the emitter area factor is 1. Thus, the gain is dependent on only the resistance values.

Figure 3:
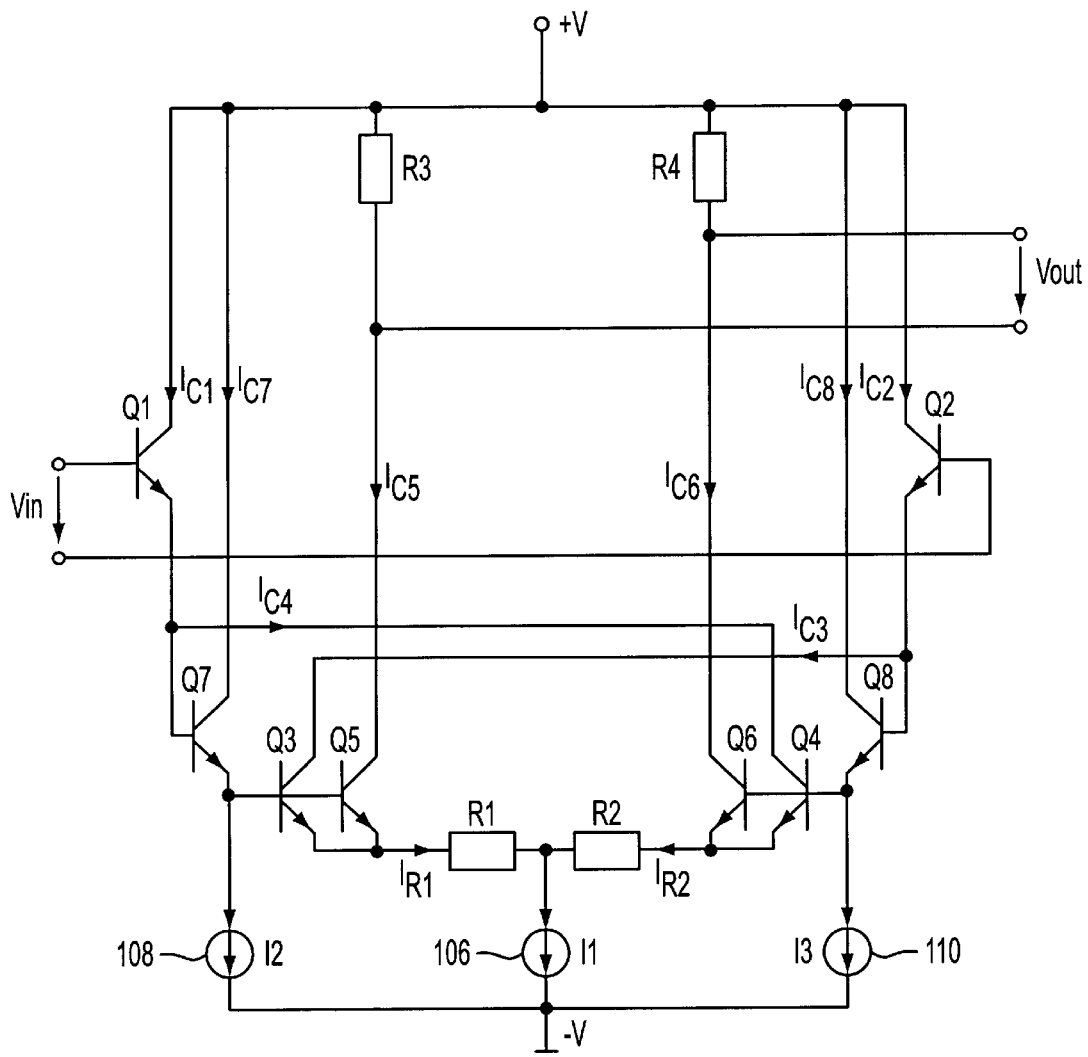
FIG. 3 illustrates a differential amplifier having an additional level shifting between an emitter follower pair and differential pairs in accordance with one embodiment of the present invention.

The differential amplifier 100 may also include an additional emitter follower pair to provide additional level shifting. For example, FIG. 3 illustrates a differential amplifier 300 having an additional level shifting between the emitter follower pair and the differential pairs in accordance with one embodiment of the present invention. The differential amplifier 300 adds an additional emitter follower pair between the common bases of the main and secondary differential pairs and the emitter follower pair of transistors Q1 and Q2.

The additional emitter follower pair includes transistors Q7 and Q8, which are preferably bipolar junction transistors having a base, a collector, and an emitter. The bases of transistors Q7 and Q8 are coupled to the emitter of transistors Q1 and Q2. The collector of transistors Q7 and Q8 are coupled to positive voltage rail +V. The emitter of transistor Q7 is coupled to the common bases of transistors Q3 and Q5 while the emitter of transistor Q8 is coupled to the common bases of transistors Q4 and Q6. The transistors Q7 and Q8 are preferably matching transistors with substantially matching emitter areas.

The differential amplifier 300 also provides a pair of current sources 108 and 110, which are coupled between the emitters of transistors Q7 and Q8, respectively, and negative voltage rail −V. The current sources 108 and 110 provide emitter currents I2 and I3, respectively, to transistors Q7 and Q8, respectively, for setting a proper operating point. Assuming that the base currents of transistors are negligible, the emitter currents I2 and I3 are equal to collector currents $I_{C7}$ and $I_{C8}$ of transistors Q7 and Q8, respectively.

The additional emitter follower pair transistors Q7 and Q8 are provide additional level shifting of the differential input voltage Vin. The additional level shifting provides a voltage drop between the base and collector of transistors Q3 and Q4, thus allowing a larger amplitude for the output voltage Vout. In addition, the additional emitter follower provides additional current gain, which reduces the differential pair transistors' influence on the base currents. The gain of the differential amplifier is determined in accordance with equation (1) above.

Figure 4:
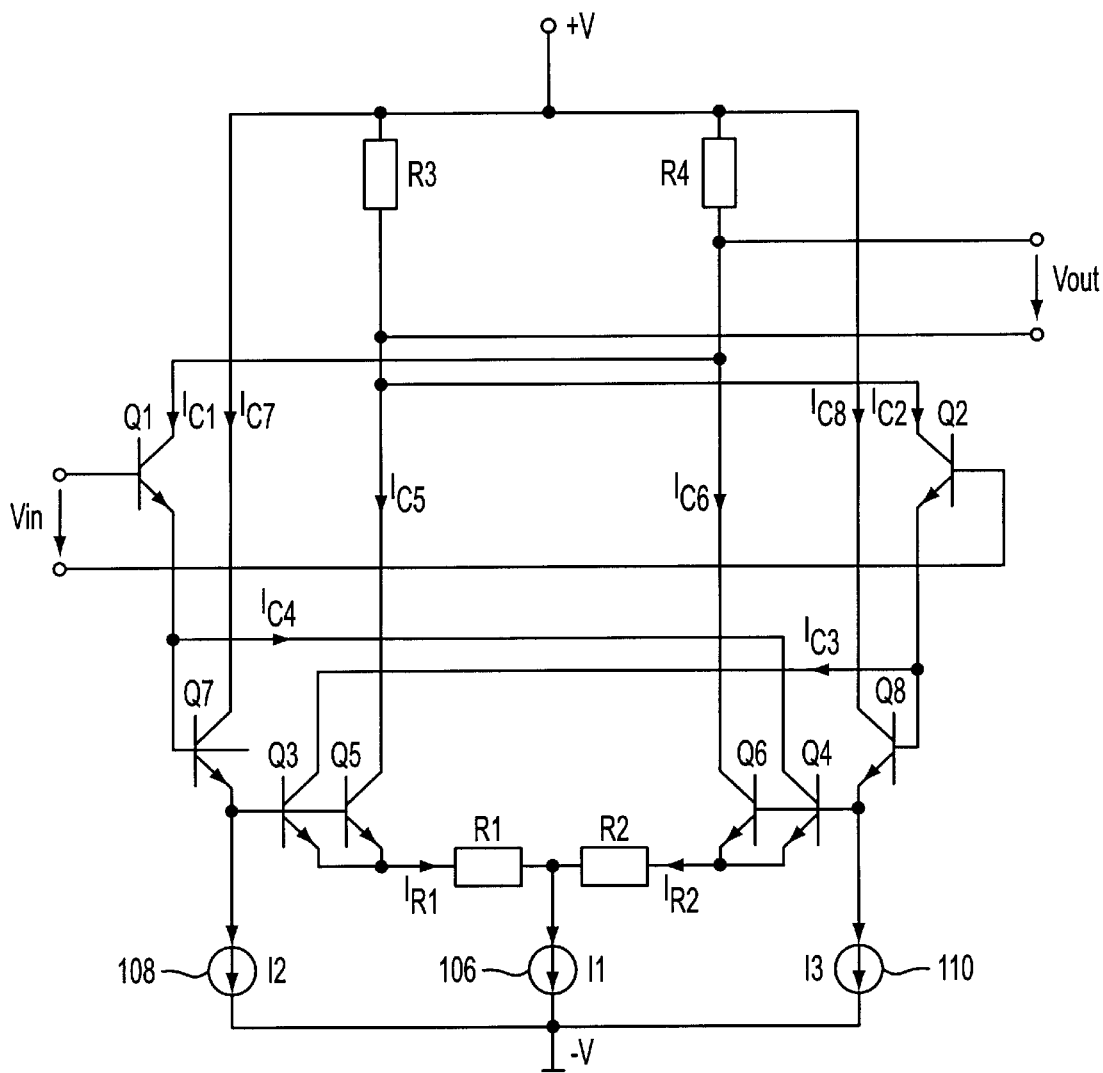
FIG. 4 illustrates a differential amplifier having both an additional level shifting and feedback of collector currents of emitter follower transistors Q1 and Q2 to load resistors R4 and R3 in accordance with one embodiment of the present invention.

The features of the differential amplifiers 200 and 300 may be combined. By way of example, FIG. 4 illustrates a differential amplifier 400 having both an additional level shifting and feedback of the collector currents of emitter follower transistors Q1 and Q2 to the load resistors R4 and R3 in accordance with one embodiment of the present invention. The differential amplifier 400 operates as described above in FIGS. 1, 2, and 3.

The differential amplifier of the present invention thus provides a large linear gain over a wide input range by compensating for transconductance variations of differential amplifier transistors. In addition, the differential amplifier provides such linear gain even in low current and low voltage applications by utilizing level shifting circuitry. Furthermore, the gain of the differential amplifier is highly predictable because the gain depends only on a set of resistors and not on the transconductance of transistors in the differential amplifier.

While the present invention has been described in terms of several preferred embodiments, there are alterations, permutations, and equivalents which fall within the scope of this invention. It should also be noted that there are alternative ways of implementing both the method and apparatus of the present invention. It is therefore intended that the following appended claims be interpreted as including all such alterations, permutations, and equivalents as fall within the true spirit and scope of the present invention.

What is claimed is:

1. A differential amplifier, comprising:
   an emitter follower pair operative to receive an input differential voltage signal for shifting the input differential voltage signal to develop a shifted differential voltage signal;
   a first differential pair configured to feed a first differential current inversely to the emitter follower pair such that a transconductance of the emitter follower pair changes inversely to compensate for a change in a transconductance of the first differential pair; and
   a main differential amplifier, including a fifth transistor with an emitter, a sixth transistor with an emitter, and a first resistor and a second resistor coupled in series between the emitters of the fifth and sixth transistors, wherein the main differential amplifier is coupled to receive the shifted differential voltage signal and being configured to amplify the shifted differential voltage signal to generate an output voltage signal.

2. The differential amplifier as recited in claim 1, wherein the emitter follower pair includes a first transistor and a second transistor and wherein the first differential pair includes a third transistor and a fourth transistor, wherein transconductances of the first transistor and the second transistor changes to compensate for changes in transconductances of the fourth and third transistors, respectively.

3. The differential amplifier as recited in claim 2, wherein the first, second, third, fourth, fifth, and sixth transistors are bipolar junction transistors, each transistor having a base, a collector, and an emitter.

4. A differential amplifier, comprising:
   an emitter follower pair, including a first transistor and a second transistor, operative to receive an input differential voltage signal for shifting the input differential voltage signal to develop a shifted differential voltage signal;
   a first differential pair, including a third transistor and a fourth transistor, configured to feed a first differential current inversely to the emitter follower pair such that a transconductances of the first transistor and the second transistor changes to compensate for changes in transconductances of the fourth and third transistors, respectively;
   a main differential amplifier, including a fifth transistor with an emitter, a sixth transistor with an emitter, and a first resistor and a second resistor coupled in series between the emitters of the fifth and sixth transistors, wherein the main differential amplifier is coupled to receive the shifted differential voltage signal and being configured to amplify the shifted differential voltage signal to generate an output voltage signal;
   wherein the first, second, third, fourth, fifth, and sixth transistors are bipolar junction transistors, each transistor having a base, a collector, and an emitter; and
   wherein the emitters of the first and second transistors are coupled to the bases of the third and fourth transistors, respectively, wherein the third and fifth transistors are coupled in parallel at their bases and emitters, and wherein the fourth and sixth transistors are coupled in parallel at their bases and emitters.

5. The differential amplifier as recited in claim 4, wherein the collector of the fourth transistor is coupled to the emitter of the first transistor and the collector of the third transistor is coupled to the emitter of the second transistor such that collector currents of the third and fourth transistors are fed inversely to the second and first transistors, respectively.

6. The differential amplifier as recited in claim 5, wherein base-emitter voltages of first and second transistors change to compensate for changes in base-emitter voltages of the fourth and third transistors, respectively.

7. The differential amplifier as recited in claim 2, wherein the first, second, third, and fourth transistors are matching transistors.

8. The differential amplifier as recited in claim 2, wherein the fifth and sixth transistors are matching transistors.

9. The differential amplifier as recited in claim 2, wherein the first, second, third, fourth, fifth and sixth transistors are matching transistors.

10. A differential amplifier, comprising:
an emitter follower pair, including a first transistor and a second transistor, operative to receive an input differential voltage signal for shifting the input differential voltage signal to develop a shifted differential voltage signal;
a first differential pair, including a third transistor and a fourth transistor, configured to feed a first differential current inversely to the emitter follower pair such that a transconductance of the emitter follower pair changes inversely to compensate for a change in a transconductance of the first differential pair;
a main differential amplifier including:
  a second differential pair including a fifth transistor and a sixth transistor, wherein the second differential pair is adapted to receive the shifted differential voltage to generate the output signal;
  a first resistor and a second resistor coupled in series between the emitters of the fifth and sixth transistors, the first and second resistor being coupled to each other at a junction;
  a first current source coupled to the junction for providing a current through the first and second resistors; and
  a first load resistor and a second load resistor coupled to the collectors of the fifth and sixth transistors, respectively;
wherein the main differential amplifier is coupled to receive the shifted differential voltage signal and being configured to amplify the shifted differential voltage signal to generate an output voltage signal;
wherein the first, second, third, fourth, fifth, and sixth transistors are bipolar junction transistors, each transistor having a base, a collector, and an emitter;
wherein the emitters of the first and second transistors are coupled to the bases of the third and fourth transistors, respectively, wherein the third and fifth transistors are coupled in parallel at their bases and emitters, and wherein the fourth and sixth transistors are coupled in parallel at their bases and emitters; and
wherein the transconductances of the first transistor and the second transistor change to compensate for changes in transconductances of the fourth and third transistors, respectively.

11. The differential amplifier as recited in claim 10, wherein the first and second resistors are matching resistors and the first and second load resistors are matching resistors.

12. The differential amplifier as recited in claim 10, wherein the first and second resistors and the first and second load resistors are all matching resistors to provide a process-independent gain.

13. The differential amplifier as recited in claim 11, wherein the gain of the differential amplifier is determined in accordance with the values of the first resistor, the first load resistor, an emitter area of the sixth transistor, and an emitter area of the fourth transistor.

14. The differential amplifier as recited in claim 11, wherein the output is taken from the collectors of the fifth and sixth transistors.

15. The differential amplifier as recited in 10, wherein the output is taken from the collector of the fifth transistor.

16. The differential amplifier as recited in claim 10, wherein the collectors of the first and sixth transistors are coupled together and wherein the collectors of the second and fifth transistors are coupled together.

17. The differential amplifier as recited in claim 16, wherein the gain of the differential amplifier is determined in accordance with the values of the first resistor and the first load resistor.

18. The differential amplifier as recited in claim 16, wherein the gain of the differential amplifier is independent of the emitter areas of the transistors.

19. The differential amplifier as recited in claim 10, further comprising:
a secondary emitter follower pair coupled between the emitter follower pair and the second differential pair to further shift the shifted differential voltage from the emitter follower pair.

20. The differential amplifier as recited in claim 19, wherein the secondary emitter follower pair includes a seventh transistor and an eighth transistor, which are bipolar junction transistors having a base, a collector, and an emitter.

21. The differential amplifier as recited in claim 20, wherein the seventh and eighth transistor are matching transistors.

22. The differential amplifier as recited in claim 21, where in the bases of the seventh and eighth transistors are coupled to the emitters of the first and second transistors, respectively, and wherein the emitters of the seventh and eighth transistors are coupled to the base of the fifth and sixth transistors, respectively.

23. The differential amplifier as recited in claim 22, further comprising:
a second current source coupled to the emitter of the seventh transistor; and
a third current source coupled to the emitter of the eighth transistor, wherein the second and third current sources are operative to set collector currents for the seventh and eighth transistors, respectively.

24. The differential amplifier as recited in claim 19, wherein the collectors of the first and sixth transistors are coupled together and wherein the collectors of the second and fifth transistors are coupled together.

25. The differential amplifier as recited in claim 24, wherein the collector currents of the third and fourth transistors are fed back to the first and second load resistors, respectively.

26. The differential amplifier as recited in claim 24, wherein the gain of the differential amplifier is determined in accordance with the values of the first resistor and the first load resistor.

27. The differential amplifier as recited in claim 23, wherein the gain of the differential amplifier is independent of the emitter areas of the transistors.

28. A transconductance compensating circuit for a differential amplifier having a main differential pair, comprising:
an emitter follower pair operative to receive an input differential voltage signal for shifting the input differential voltage signal to develop a shifted differential voltage signal;
a first differential pair configured to feed a first differential current inversely to the emitter follower pair such that a transconductance of the emitter follower pair changes inversely to compensate for a change in a transconductance of the first differential pair; and
wherein the main differential pair includes a second differential pair including a fifth transistor with an emitter, a sixth transistor with an emitter, wherein a first resistor and a second resistor are coupled in series between the emitters of the fifth and sixth transistors, and wherein the second differential pair is adapted to receive the shifted differential voltage signal to generate an output signal.

29. The differential amplifier as recited in claim 28, wherein the emitter follower pair includes a first transistor and a second transistor and wherein the first differential pair includes a third transistor and a fourth transistor, wherein transconductances of the first transistor and the second transistor changes to compensate for changes in transconductances of the fourth and third transistors, respectively.

30. The differential amplifier as recited in claim 29, wherein the first, second, third, fourth, fifth, and sixth transistors are bipolar junction transistors, each transistor having a base, a collector, and an emitter.

31. The differential amplifier as recited in claim 30, wherein the emitters of the first and second transistors are coupled to the bases of the third and fourth transistors, respectively, wherein the third and fifth transistors are coupled in parallel at their bases and emitters, and wherein the fourth and sixth transistors are coupled in parallel at their bases and emitters.

32. The differential amplifier as recited in claim 31, wherein the collector of the fourth transistor is coupled to the emitter of the first transistor and the collector of the third transistor is coupled to the emitter of the second transistor such that collector currents of the third and fourth transistors are fed inversely to the second and first transistors, respectively.

33. The differential amplifier as recited in claim 32, wherein base-emitter voltages of first and second transistors change to compensate for changes in base-emitter voltages of the fourth and third transistors, respectively.

34. The differential amplifier as recited in claim 29, wherein the first, second, third, and fourth transistors are matching transistors.

35. The differential amplifier as recited in claim 29, wherein the fifth and sixth transistors are matching transistors.

36. The differential amplifier as recited in claim 29, wherein the first, second, third, fourth, fifth and sixth transistors are matching transistors.

37. The differential amplifier as recited in claim 36, wherein the main differential amplifier further includes:
    a first resistor and a second resistor coupled in series between the emitters of the fifth and sixth transistors, the first and second resistor being coupled to each other at a junction;
    a first current source coupled to junction for providing a current through the first and second resistors; and
    a first load resistor and a second load resistor coupled to the collectors of the fifth and sixth transistors, respectively.

38. The differential amplifier as recited in claim 37, wherein the first and second resistors are matching resistors and the first and second load resistors are matching resistors.

39. The differential amplifier as recited in claim 38, wherein the gain of the differential amplifier is determined in accordance with the values of the first resistor, the first load resistor, an emitter area of the sixth transistor, and an emitter area of the fourth transistor.

40. The differential amplifier as recited in claim 38, wherein the first and second resistors and the first and second load resistors are all matching transistors to provide a process-independent gain.

41. The differential amplifier as recited in claim 37, wherein the output is taken from the collectors of the fifth and sixth transistors.

42. The differential amplifier as recited in 37, wherein the output is taken from the collector of the fifth transistor.

43. The differential amplifier as recited in claim 37, wherein the collectors of the first and sixth transistors are coupled together and wherein the collectors of the second and fifth transistors are coupled together.

44. The differential amplifier as recited in claim 40, wherein the gain of the differential amplifier is determined in accordance with the values of the first resistor and the first load resistor.

45. The differential amplifier as recited in claim 40, wherein the gain of the differential amplifier is independent of the emitter areas of the transistors.

46. The differential amplifier as recited in claim 37, further comprising:
    a secondary emitter follower pair coupled between the emitter follower pair and the second differential pair to further shift the shifted differential voltage from the emitter follower pair.

47. The differential amplifier as recited in claim 46, wherein the secondary emitter follower pair includes a seventh transistor and an eighth transistor, which are bipolar junction transistors having a base, a collector, and an emitter.

48. The differential amplifier as recited in claim 47, wherein the seventh and eighth transistor are matching transistors.

49. The differential amplifier as recited in claim 48, wherein the bases of the seventh and eighth transistors are coupled to the emitters of the first and second transistors, respectively, and wherein the emitters of the seventh and eighth transistors are coupled to the base of the fifth and sixth transistors, respectively.

50. The differential amplifier as recited in claim 49, further comprising:
    a second current source coupled to the emitter of the seventh transistor; and
    a third current source coupled to the emitter of the eighth transistor, wherein the second and third current sources are operative to set collector currents for the seventh and eighth transistors, respectively.

51. The differential amplifier as recited in claim 46, wherein the collectors of the first and sixth transistors are coupled together and wherein the collectors of the second and fifth transistors are coupled together.

52. The differential amplifier as recited in claim 51, wherein the collector currents of the third and fourth transistors are fed back to the first and second load resistors, respectively.

53. The differential amplifier as recited in claim 51, wherein the gain of the differential amplifier is determined in accordance with the values of the first resistor and the first load resistor.

54. The differential amplifier as recited in claim 49, wherein the gain of the differential amplifier is independent of the emitter areas of the transistors.

55. A method for compensating variations in transconductance of a differential amplifier, the method comprising:
    receiving, by a pair of emitter follower transistors, a differential input voltage;
    providing, by a differential pair of transistors, a compensating differential current inversely to the emitter follower transistors, wherein each of the differential pair of transistors has a first terminal, wherein a first resistor and a second resistor are coupled in series between the first terminals of the differential pair of transistors;
    changing a transconductance of the emitter follower transistors inversely to compensate for a change in a transconductance of the differential pair transistors; and
    shifting, by the emitter follower pair of transistors, the DC voltage level of the differential input voltage by a specified voltage in accordance with the change in the transconductance of the emitter follower pair transistors.

56. The method as recited in claim 55, further comprising:

amplifying the shifted differential input voltage; and outputting the amplified voltage as an output signal.

57. The method as recited in claim 55, wherein the differential pair of transistors and the emitter follower pair transistors are matching transistors.

58. The method as recited in claim 55, wherein the differential amplifier includes a pair of matching transistors, wherein the differential pair of transistors, the emitter follower pair transistors, and the transistors of the differential amplifier are all matching transistors.

59. A transconductance compensating circuit for a differential amplifier having a main differential pair, comprising:

input means for receiving and shifting an input differential voltage signal to develop a shifted differential voltage signal; and means for providing a first differential current inversely to the input means such that a transconductance of the receiving and shifting means changes inversely to compensate for a change in a transconductance of the differential current providing means, wherein the differential current providing means includes a third transistor and a fourth transistor, wherein the third transistor and the fourth transistor each has a first terminal, wherein a first resistor and a second resistor are coupled in series between the first terminals of the third transistor and the fourth transistor.

60. The differential amplifier as recited in claim 59, wherein the input means includes a first transistor and a second transistor and wherein the differential current providing means includes a third transistor and a fourth transistor, wherein transconductances of the first transistor and the second transistor changes to compensate for changes in transconductances of the fourth and third transistors, respectively.

61. The differential amplifier as recited in claim 60, wherein the main differential amplifier includes a second differential pair including a fifth transistor and a sixth transistor, the second differential pair, wherein the second differential pair is adapted to receive the shifted differential voltage signal to generate the output signal.

62. The differential amplifier as recited in claim 60, wherein the first, second, third, and fourth transistors are matching transistors.

63. The differential amplifier as recited in claim 61, wherein the fifth and sixth transistors are matching transistors.

64. The differential amplifier as recited in claim 61, wherein the first, second, third, fourth, fifth, and sixth transistors are all matching transistors.

65. A differential amplifier, comprising:

an emitter follower pair operative to receive an input differential voltage signal for shifting the input differential voltage signal to develop a first shifted differential voltage signal;

a first differential pair, including a third transistor and a fourth transistor, configured to feed a first differential current inversely to the emitter follower pair such that a transconductance of the emitter follower pair changes inversely to compensate for a change in a transconductance of the first differential pair;

a second emitter follower pair coupled to receive the first shifted differential voltage signal for shifting the shifted differential voltage signal to develop a second shifted differential voltage signal; and a main differential amplifier, including a second differential pair which includes a fifth transistor and a sixth transistor, coupled to receive the second shifted differential voltage signal and being configured to amplify the second shifted differential voltage signal to generate an output voltage signal.

\* \* \* \* \*

UNITED STATES PATENT AND TRADEMARK OFFICE
CERTIFICATE OF CORRECTION

PATENT NO. : 6,188,280 B1  
DATED : February 13, 2001  
INVENTOR(S) : Jan Filip

Page 1 of 1

It is certified that error appears in the above-identified patent and that said Letters Patent is hereby corrected as shown below:

<u>Column 10, claim 22,</u>  
Lines 17 & 18, reads:  
"22. The differential amplifier as recited in claim 21, where in the bases of the seventh and eighth transistors are coupled"  
It should read:  
-- 22. The differential amplifier as recited in claim 21, wherein the bases of the seventh and eighth transistors are coupled --.

Signed and Sealed this

Twenty-ninth Day of January, 2002

Attest:

JAMES E. ROGAN  
*Director of the United States Patent and Trademark Office*

*Attesting Officer*